United States Patent
Pons

(10) Patent No.: US 10,018,032 B2
(45) Date of Patent: Jul. 10, 2018

(54) STRESS CALCULATIONS FOR SUCKER ROD PUMPING SYSTEMS

(71) Applicant: Weatherford Technology Holdings, LLC, Houston, TX (US)

(72) Inventor: Victoria M. Pons, Katy, TX (US)

(73) Assignee: Weatherford Technology Holdings, LLC, Houston, TX (US)

(*) Notice: Subject to any disclaimer, the term of this patent is extended or adjusted under 35 U.S.C. 154(b) by 381 days.

(21) Appl. No.: 14/751,940

(22) Filed: Jun. 26, 2015

(65) Prior Publication Data

US 2015/0377006 A1    Dec. 31, 2015

Related U.S. Application Data

(60) Provisional application No. 62/019,742, filed on Jul. 1, 2014, provisional application No. 62/019,396, filed on Jun. 30, 2014.

(51) Int. Cl.
*G06F 17/50* (2006.01)
*E21B 47/00* (2012.01)
*E21B 43/12* (2006.01)

(52) U.S. Cl.
CPC ........ *E21B 47/0006* (2013.01); *E21B 43/127* (2013.01); *G06F 17/5018* (2013.01)

(58) Field of Classification Search
CPC . E21B 47/0006; E21B 43/121; G06F 17/5018
USPC .................................................. 703/2, 9, 10
See application file for complete search history.

(56) References Cited

U.S. PATENT DOCUMENTS

| | | | |
|---|---|---|---|
| 3,343,409 A | 9/1967 | Gibbs | |
| 8,055,490 B2* | 11/2011 | Kim | G06F 17/5018 434/118 |
| 8,322,995 B2 | 12/2012 | Ehimeakhe et al. | |
| 8,768,659 B2* | 7/2014 | Vasudevan | G06F 17/18 703/2 |
| 2010/0111716 A1* | 5/2010 | Gibbs | E21B 47/0008 417/63 |

(Continued)

FOREIGN PATENT DOCUMENTS

| | | |
|---|---|---|
| CA | 2526345 A1 | 4/2007 |
| WO | 2010/051270 A1 | 5/2010 |
| WO | 2013/063591 A2 | 5/2013 |

OTHER PUBLICATIONS

Ehimeakhe, V.: "Calculating Pump Fillage for Well Control using Transfer Point Location," SPE Eastern Regional Meeting, Oct. 12-14, 2010, Morgantown, West Virginia, USA.

(Continued)

*Primary Examiner* — Eunhee Kim
(74) *Attorney, Agent, or Firm* — Patterson & Sheridan, LLP

(57) ABSTRACT

Techniques and apparatus are provided for stress calculations for sucker rod pumping systems. A method is provided for determining stress along a sucker rod string disposed in a wellbore. The method generally includes receiving, at a processor, measured rod displacement and rod load data for the sucker rod string, wherein the sucker rod string comprises a plurality of sections; and calculating stress values at a plurality of finite difference nodes for at least one of the plurality of sections based, at least in part, on the measured rod displacement and rod load data.

20 Claims, 13 Drawing Sheets

(56) References Cited

U.S. PATENT DOCUMENTS

2013/0104645 A1\* 5/2013 Pons .................. F04B 49/065
73/152.61

OTHER PUBLICATIONS

Ehimeakhe, V.: "Comparative Study of Downhole Cards Using Modified Everitt-Jennings Method and Gibbs Method," Southwestern Petroleum Short Course 2010.
Gibbs, S. G.: "A General Method for Predicting Rod Pumping System Performance," SPE Annual Fall Technical Conference and Exhibition, Oct. 1977, Denver, Colorado.
Pons-Ehimeakhe, V.: "Modified Everitt-Jennings Algorithm with Dual Iteration on the Damping Factors," 2012 SouthWestern Petroleum Short Course, Lubbock TX, Apr. 17-18.
Schafer, D. J. and Jennings, J. W.: "An Investigation of Analytical and Numerical Sucker-Rod Pumping Mathematical Models," paper SPE 16919 presented at the 1987 SPE Annual Technical Conference and Exhibition, Dallas, Sep. 27-30.
European Search Report dated Oct. 16, 2015, issued by the European Patent Office in Munich, Germany in Application No. EP 15 17 4273.
Everitt et al., "An Improved Finite-Difference Calculation of Downhole Dynamometer Cards for Sucker-Rod Pumps," SPE Production Engineering, vol. 7, No. 1, Feb. 1992, pp. 121-127.

\* cited by examiner

| Taper Number | Rod Description Grade / Size | Number of Rods (Taper) | Rod Length (Ft.) | Service Factor | Degrees deviation | Drag Coef. | Up Stroke Damping | Down Stroke Damping | Guides/ Used? (Y/N) (#) |
|---|---|---|---|---|---|---|---|---|---|
| 1 | N97 - 1.000 | 80 | 25.00 | 0.0 | 0.00 | 0.00 | 0.0254630 | 0.0616151 | N |
| 2 | N97 - 0.875 | 92 | 25.00 | 0.0 | 0.00 | 0.00 | 0.0219769 | 0.0497895 | N |
| 3 | N97 - 0.750 | 90 | 25.00 | 0.0 | 0.00 | 0.00 | 0.0194518 | 0.0383795 | N |
| 4 | SB (C) - 1.500 | 14 | 25.00 | 0.0 | 0.00 | 0.00 | 0.0416875 | 0.1055855 | N |

FIG. 5

| Taper Number | Rod Description Grade / Size | Number of Rods (Taper) | Rod Length (Ft.) | Service Factor | Degrees deviation | Drag Coef. | Up Stroke Damping | Down Stroke Damping | Guides/ Used? (Y/N) (#) |
|---|---|---|---|---|---|---|---|---|---|
| 1 | K - 1.000 | 61 | 25.00 | 0.9 | 0.00 | 0.00 | 0.0254630 | 0.0616151 | N |
| 2 | KD - 0.875 | 81 | 25.00 | 0.9 | 0.00 | 0.00 | 0.0219769 | 0.0497895 | N |
| 3 | KD - 0.750 | 65 | 25.00 | 0.9 | 0.00 | 0.00 | 0.0194518 | 0.0383795 | N |
| 4 | SB (D) - 1.500 | 18 | 25.00 | 0.9 | 0.00 | 0.00 | 0.0490177 | 0.1230735 | N |

900

| DEPTH | TAPER | ELEMENTS | SMIN | SMAX | SMAXALLOW |
|---|---|---|---|---|---|
| 0.00 | 1 | 0 | 9523.33 | 24558.04 | 25276.53 |
| 108.93 | 1 | 1 | 9596.21 | 24511.50 | 25315.47 |
| 217.86 | 1 | 2 | 9223.35 | 24045.85 | 25116.23 |
| 326.79 | 1 | 3 | 8854.50 | 23576.20 | 24919.12 |
| 435.71 | 1 | 4 | 8489.45 | 23101.46 | 24724.05 |
| 544.64 | 1 | 5 | 8128.27 | 22622.73 | 24531.05 |
| 653.57 | 1 | 6 | 7770.97 | 22138.92 | 24340.11 |
| 762.50 | 1 | 7 | 7417.14 | 21651.11 | 24151.03 |
| 871.43 | 1 | 8 | 7066.91 | 21159.82 | 23963.88 |
| 980.36 | 1 | 9 | 6720.29 | 20664.80 | 23778.65 |
| 1089.29 | 1 | 10 | 6377.07 | 20166.03 | 23595.24 |
| 1198.21 | 1 | 11 | 6037.12 | 196645.13 | 23413.58 |
| 1307.14 | 1 | 12 | 5700.51 | 19160.77 | 23233.71 |
| 1416.07 | 1 | 13 | 5364.04 | 18654.79 | 23053.91 |
| 1631.58 | 2 | 14 | 6699.96 | 24062.67 | 30892.79 |
| 1738.16 | 2 | 15 | 6412.11 | 23592.31 | 30738.97 |
| 1844.74 | 2 | 16 | 6081.71 | 23093.20 | 30562.41 |
| 1951.32 | 2 | 17 | 5754.53 | 22591.40 | 30387.58 |
| 2057.89 | 2 | 18 | 5430.58 | 22088.52 | 30214.46 |
| 2164.47 | 2 | 19 | 5109.84 | 21584.04 | 30043.07 |
| 2271.05 | 2 | 20 | 4792.73 | 21078.75 | 29873.61 |
| 2377.63 | 2 | 21 | 4478.90 | 20572.38 | 29705.91 |
| 2484.21 | 2 | 22 | 4168.23 | 20065.75 | 29539.90 |
| 2590.79 | 2 | 23 | 3860.99 | 19557.78 | 29375.71 |
| 2697.37 | 2 | 24 | 3557.10 | 19049.53 | 29213.32 |
| 2803.95 | 2 | 25 | 3256.56 | 18555.79 | 29052.72 |
| 2910.53 | 2 | 26 | 2958.98 | 18067.14 | 28893.70 |
| 3017.11 | 2 | 27 | 2664.88 | 17577.69 | 28736.55 |
| 3123.68 | 2 | 28 | 2373.94 | 17085.82 | 28581.08 |
| 3230.26 | 2 | 29 | 2085.82 | 16591.00 | 28427.11 |
| 3336.84 | 2 | 30 | 1800.86 | 16094.30 | 28274.83 |
| 3443.42 | 2 | 31 | 1518.78 | 15596.26 | 28124.09 |
| 3658.33 | 3 | 32 | 2059.82 | 21032.21 | 28413.21 |
| 3766.67 | 3 | 33 | 1816.08 | 20557.01 | 28282.96 |
| 3875.00 | 3 | 34 | 1534.45 | 20038.55 | 28132.47 |
| 3983.33 | 3 | 35 | 1256.45 | 19518.78 | 27983.92 |
| 4091.67 | 3 | 36 | 982.16 | 18997.42 | 27837.34 |
| 4200.00 | 3 | 37 | 711.56 | 18474.48 | 27692.74 |
| 4308.33 | 3 | 38 | 444.26 | 17950.74 | 27549.90 |
| 4416.67 | 3 | 39 | 180.39 | 17433.08 | 27408.89 |
| 4525.00 | 3 | 40 | -80.04 | 16931.53 | 27269.73 |
| 4633.33 | 3 | 41 | -337.24 | 16428.13 | 27132.29 |
| 4741.67 | 3 | 42 | -591.34 | 15920.51 | 26996.50 |
| 4850.00 | 3 | 43 | -846.68 | 15409.98 | 26860.05 |
| 4958.33 | 3 | 44 | -1102.56 | 14896.28 | 26723.32 |
| 5066.67 | 3 | 45 | -1352.56 | 14379.41 | 26589.72 |
| 5265.00 | 4 | 46 | -1753.08 | 1872.12 | 26375.70 |
| 5355.00 | 4 | 47 | -1909.14 | 1577.43 | 26292.30 |
| 5445.00 | 4 | 48 | -2143.68 | 1134.11 | 26166.97 |
| 5535.00 | 4 | 49 | -2377.33 | 693.38 | 26042.12 |

FIG. 9

| DESIRED DEPTH | 1637.000 |
|---|---|
| MINIMUM STRESS FOR GIVEN DEPTH | 6016.86 |
| MAXIMUM STRESS FOR GIVEN DEPTH | 26949.35 |
| MAXIMUM ALLOWABLE STRESS FOR GIVEN DEPTH | 52256.33 |

FIG. 12

| DESIRED DEPTH | 1637.000 |
|---|---|
| MINIMUM STRESS FOR GIVEN DEPTH | 6685.90 |
| MAXIMUM STRESS FOR GIVEN DEPTH | 24039.12 |
| MAXIMUM ALLOWABLE STRESS FOR GIVEN DEPTH | 30885.28 |

FIG. 13

STRESS CALCULATIONS FOR SUCKER ROD PUMPING SYSTEMS

CLAIM OF PRIORITY UNDER 35 U.S.C. § 119

This application claims benefit of U.S. Provisional Patent Application Ser. No. 62/019,396, filed Jun. 30, 2014 and entitled "OPTIMAL STRESS CALCULATIONS FOR SUCKER ROD PUMPING SYSTEMS," and U.S. Provisional Patent Application Ser. No. 62/019,742, filed Jul. 1, 2014 and entitled "OPTIMAL STRESS CALCULATIONS FOR SUCKER ROD PUMPING SYSTEMS," which are both herein incorporated by reference in their entireties.

BACKGROUND

Field of the Disclosure

Aspects of the present disclosure generally relate to hydrocarbon production using artificial lift, and, more particularly, to a technique for stress calculations at any depth for sucker rod pumping systems.

Description of the Related Art

To obtain production fluids (e.g., hydrocarbons), a wellbore is drilled into the earth to intersect a productive formation. Upon reaching the productive formation, pumps can be used in wells to help bring production fluids from the productive formation to a wellhead located at the surface. This is often referred to as providing artificial lift, as the reservoir pressure may be insufficient for the production fluid to reach the surface on its own (i.e., natural lift).

The production of oil with a sucker-rod pump is common practice in the oil and gas industry. An oil well generally comprises a casing, a string of smaller steel pipe inside the casing and generally known as the tubing, a pump at the bottom of the well, and a string of steel rod elements, commonly referred to as sucker rods, within the tubing and extending down into the pump for operating the pump. Various devices as are well known in the art are provided at the top of the well for reciprocating the sucker rod to operate the pump.

SUMMARY

The systems, methods, and devices of the disclosure each have several aspects, no single one of which is solely responsible for its desirable attributes. Without limiting the scope of this disclosure, some features will now be discussed briefly. After considering this discussion, and particularly after reading the section entitled "Detailed Description," one will understand how the features of this disclosure provide advantages that include improved production for artificially lifted wells.

Aspects of the present disclosure generally relate to hydrocarbon production using artificial lift, and, more particularly, to a technique for stress calculations at any depth for sucker rod pumping systems.

One aspect of the present disclosure is a method for determining stress along a sucker rod string disposed in a wellbore. The method generally includes receiving, at a processor, measured rod displacement and rod load data for the sucker rod string, wherein the sucker rod string comprises a plurality of sections; and calculating stress values at a plurality of finite difference nodes for at least one of the plurality of sections based, at least in part, on the measured rod displacement and rod load data.

Another aspect of the present disclosure is a system. The system generally includes a sucker rod string comprising a plurality of sections disposed in a wellbore; at least one sensor configured to measure rod displacement of the sucker rod string; at least one sensor configured to measure rod loading of the sucker rod string; and a processor configured to calculate stress values at a plurality of finite difference nodes for at least one of the plurality of sections based, at least in part, on the measured rod displacement and rod load data.

Yet another aspect of the present disclosure is a computer-readable medium. The computer readable medium generally includes computer executable code stored thereon for receiving measured rod displacement and rod load data for a sucker rod string, wherein the sucker rod string comprises a plurality of sections; and calculating stress values at a plurality of finite difference nodes for at least one of the plurality of sections based, at least in part, on the measured rod displacement and rod load data.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only typical aspects of this disclosure and are therefore not to be considered limiting of its scope, for the disclosure may admit to other equally effective aspects.

FIG. 5 is table showing a rod configuration for the first example well, in accordance with certain aspects of the present disclosure.

FIG. 9 is a table showing results of stress analysis for the second example well, in accordance with certain aspects of the present disclosure.

FIG. 12 is a table showing example interpolated results for the minimum stress, maximum stress, and maximum allowable stress for a given depth for the first example well, in accordance with certain aspects of the present disclosure.

FIG. 13 is an example table showing example interpolated results for the minimum stress, maximum stress, and maximum allowable stress for a given depth for the second example well, in accordance with certain aspects of the present disclosure.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. The detailed description and drawings are merely illustrative of the disclosure rather than limiting, the scope of the disclosure being defined by the appended claims and equivalents thereof.

Aspects of the present disclosure provide techniques for stress calculations for sucker rod pumping systems. This may allow well operators to accurately monitor the pump fillage and control the pump accordingly.

Example Artifical Lift System

Figure 1:
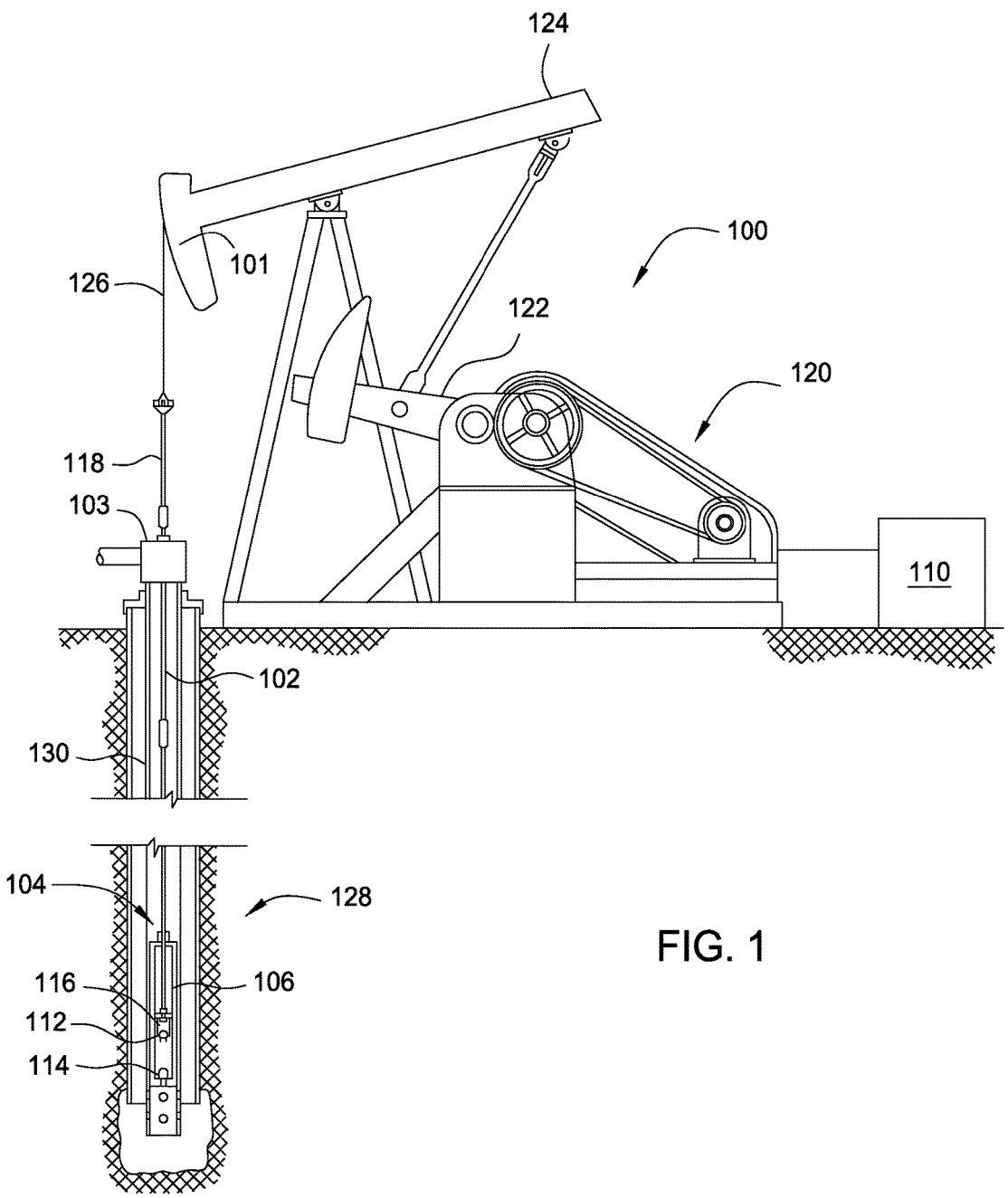
FIG. 1 illustrates a reciprocating rod lift system with a control unit for controlling the pump in an effort to extract fluid from a well, in accordance with certain aspects of the present disclosure.

The production of oil with a reciprocating rod lift system 100 (e.g., sucker-rod pump system or rod pumping lift system), such as that depicted in FIG. 1, is common practice in the oil and gas industry.

FIG. 1 illustrates a reciprocating rod lift system 100 with a control unit 110 (e.g., including a rod pump controller or variable speed drive controller) for controlling the rod pump in an effort to extract fluid from a well, according to certain aspects of the present disclosure. Although shown with a conventional pumping unit in FIG. 1, the reciprocating rod lift system 100 may employ any suitable pumping unit.

The reciprocating rod lift system 100 is driven by a motor or engine 120 that turns a crank arm 122. Attached to the crank arm 122 are a walking beam 124 and a horsehead 101. A cable 126 hangs off the horsehead 101 and is attached to a sucker rod 102 (e.g., a string of steel rod elements or a continuous rod string). The sucker rod 102 is attached to a downhole rod pump 104 located within the wellbore 128. In operation, the motor 120 turns the crank arm 122 which reciprocates the walking beam 124 which reciprocates the sucker rod 102.

In the reciprocating rod lift system 100, the rod pump 104 consists of a pump barrel 106 with a valve 114 (the "standing valve") located at the bottom that allows fluid to enter from the wellbore, but does not allow the fluid to leave. The pump barrel 106 can be attached to or part of the production tubing 130 within the wellbore 128. Inside the pump barrel 106 is a close-fitting hollow plunger 116 with another valve 112 (the "traveling valve") located at the top. This allows fluid to move from below the plunger 116 to the production tubing 130 above and does not allow fluid to return from the tubing 130 to the pump barrel 106 below the plunger 116. The plunger 116 may be moved up and down cyclically by the horsehead 101 at the surface via the sucker rod 102, where the motion of the pump plunger 116 comprises an "upstroke" and a "downstroke," jointly referred to as a "stroke." A polished rod 118, which is a portion of the rod string passing through a stuffing box 103 at the surface, may enable an efficient hydraulic seal to be made around the reciprocating rod string. A control unit 110, which may be located at the surface, may control the system 100.

Typically, the reciprocating rod lift system 100 is designed with the capacity to remove liquid from the wellbore 128 faster than the reservoir can supply liquid into the wellbore 128. As a result, the downhole pump does not completely fill with fluid on every stroke. The well is said to be "pumped-off" when the pump barrel 106 does not completely fill with fluid on the upstroke of the plunger 116. The term "pump fillage" is used to describe the percentage of the pump stroke which actually contains liquid.

Being a positive displacement pumping system, rod-pump systems (e.g., reciprocating rod lift system 100) can reduce the bottom hole pressure to a "near zero" value. The foremost goal of rod pumping optimization is to match well displacement to inflow, which may be difficult if inflow is unknown or highly uncertain. Uncertainty related to inflow may lead to an overly conservative approach, for example, where the system is designed or operated such that the pump displacement is lower than the inflow, such as by continuous pumping. In this case, the rod lift system runs without any problem and is sometimes referred to as "optimized" operation, although the well production is usually suboptimal and losing revenue. In another example, uncertainty related to inflow may lead to an overly aggressive approach, for example, where the system is designed or operated such that the pump displacement is higher than the inflow, such as by intermittent pumping. In this case, the downhole pump and rod lift system suffers from issues such as fluid pound, pump-off, gas interference, and correspondingly higher failure rates due to incomplete pump fillage.

Preventing stress related failures is part of optimizing a sucker rod pumped well (e.g., similar to pumping system illustrated in FIG. 1). Tracking the maximum and minimum rod stress along with appropriate pump off control may ensure longer life for the rods and the entire sucker-rod pumping system. The rod string 102 may be a straight string or a tapered string. A tapered string includes multiple sections (e.g., "tapers") having varying diameters. Each section, or taper, may include a plurality of rod elements. Traditionally, stress is only computed at the top of each taper; however, stress failures occur in areas of high friction and stress, which may not be near the top of the taper and, therefore, may be undetected by traditional stress computations.

Stress may be defined as a material's internal resistance per unit area when an external load is applied to it. Stress analysis is the practice of evaluating the stress distribution within a given material. In a rod string (e.g., such as rod string 102) subjected to axial tension, stress analysis may involve computing the average normal stress. In the ideal case, the rod string can be considered prismatic, for example, similar to a straight bar whose cross-section is uniform throughout its length. Although, in practice, a rod string may not be prismatic.

The yield strength of a material may be defined as the amount of stress at which the material will begin to undergo plastic deformation. The tensile strength of a material may be defined as the maximum stress the material can withstand, due to pulling or stretching, before the material fails or breaks. Even though the load applied to a component is usually well below the yield strength of the material the component is made of, the component may eventually fail through many repeated loads. For example, a small amount of damage may be done to the component with each cycle which, alone, may be insufficient to cause the component to fail, but over repeated cycles may accumulate and eventually cause a fatigue failure of the component.

The service factor is a factor used to account for the corrosiveness of the environment. The value for the service factor is typically found between zero and one, although in some case the service factor may be greater than one.

Yield strength and tensile strength may be known quantities, and therefore, for a rod string operating under normal conditions, the lifetime for that rod string may be known or predetermined. Unfortunately, due to deviation, corrosion, paraffin build up, and/or casing collapse, the normal conditions may be ideal conditions rather than actual conditions. Instead, failures and rod life may be anticipated by closely monitoring the behavior of the stress function with respect to each other throughout the rod string. Some sections of the rod string may be more sensitive than others and, therefore, a more detailed and in-depth analysis may be used for those sections.

Sucker-rod pumps (e.g., similar to the reciprocating rod lift system 100 illustrated in FIG. 1), may experience two types of failures: tensile failures and fatigue failures. A tensile failure may occur when the sucker rod is overstressed, for example, when the force exerted on the sucker rod material results in an axial pulling force overcoming the tensile strength of the material. For example, if excessive pull is applied to the sucker rod, the rod stress may exceed the rod material tensile strength causing a tensile break. Tensile failures typically occur in the rod body, where the cross-sectional area may be the smallest. Tensile failures may materialize as a permanent stretch and/or small breaks in the sucker rod. Once the sucker rod has incurred tensile failures, if the sucker rod is run again, the failure points may become stress raisers since the load bearing cross-sectional area is reduced.

Although static loads may be tensile loads, fatigue failures may occur from repeated load variations within the rod string. For example, ignoring inertial effects and rod buoyancy, on the downstroke, the rod load is equal to the rod weight, while on the upstroke, the rod load is equal to the rod weight and the fluid load. Thus the fluid load represents an alternating stress, which may lead to fatigue damage and/or failure.

Sucker rod failures are typically attributed to fatigue breaks, which may occur at stress levels well below the ultimate tensile strength or even below the yield strength of the sucker rod (e.g., made of steel material having a high tensile strength). Repeated stresses cause material fatigue or plastic tensile failure of the sucker rod. The failure may start at a stress raiser on the surface of the rod (e.g., which may be due to tensile failures caused by the repeated stresses). The incurred crack may progress in a direction perpendicular to the stress across the sucker rod, therefore reducing the cross-sectional area capable of carrying the load, at which point the rod breaks.

Rod failure may be prevented or reduced using stress analysis. Accordingly, what is needed are techniques and apparatus for stress analysis in sucker rod pumping systems.

An approach is provided herein for an in-depth, step by step, stress analysis of each section (e.g., each taper) for sucker rod pumping systems, such as the system 100 illustrated in FIG. 1, using finite differences to solve the wave equation and interpolation of stress data in order to approximate stress at any level along the rod string.

Example Stress Calculations for Sucker Rod Pumping Systems

Avoiding the creation of stress raisers caused by mechanical damage, corrosion action, and/or rod wear is desirable to prevent rod failure. The definition of the fatigue endurance limit for any material, pertaining to steel rods, is the maximum stress level at which the steel can sustain cyclic loading conditions for a minimum of ten million cycles. Additionally, changes in cross-sectional area may create areas of higher local stress. Maintaining rod stress within safe limits may help prevent rod failure.

Techniques and apparatus are provided herein for stress analysis, enabling stress computation at any level down the rod string, for example, by using finite differences and polynomial interpolation.

Figure 2:
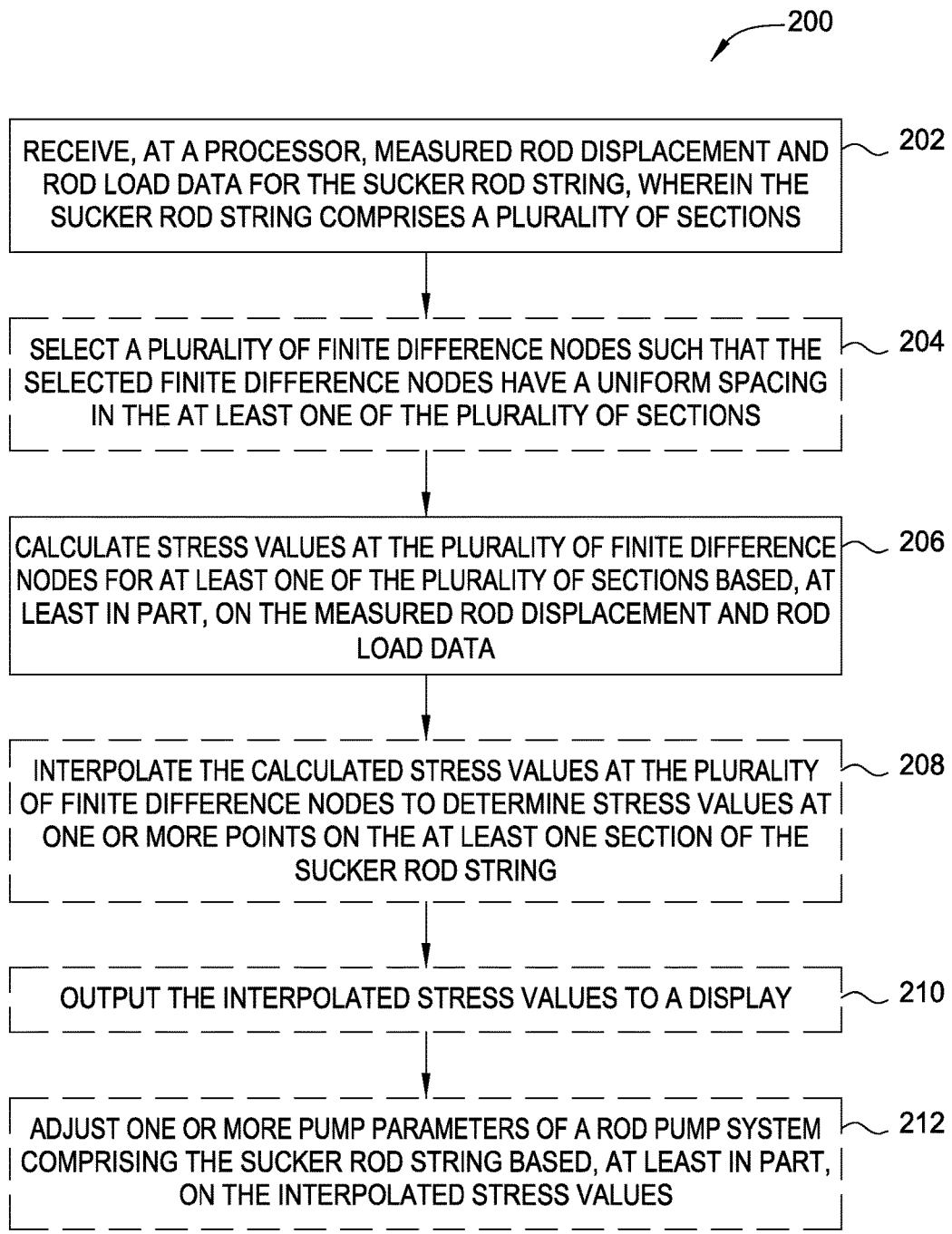
FIG. 2 is a flow chart illustrating example operations for determining stress along a sucker rod string disposed in a wellbore, in accordance with certain aspects of the present disclosure.

FIG. 2 is a flow chart illustrating example operations 200 for determining stress along a sucker rod string disposed in a wellbore, in accordance with certain aspects of the present disclosure. The operations 200 may be performed by a processor (e.g., control unit 110). The operations 200 may include, at 202, receiving measured (e.g., using one or more sensors) rod displacement and rod load data for the sucker rod string (e.g., rod string 102), wherein the sucker rod string comprises a plurality of sections (e.g., tapers).

Optionally, at 204, a plurality of finite difference nodes may be selected such that the selected finite difference nodes have a uniform spacing in at least one of the plurality of sections. As will be discussed in more detail below, the finite difference nodes may be selected such that the uniform spacing satisfies a stability condition.

At 206, stress values may be calculated at the plurality of finite difference nodes for the at least one of the plurality of sections based, at least in part, on the measured rod displacement and rod load data. As will be discussed in more detail below, the stress values may be calculated using the Modified Everitt-Jennings algorithm for the selected finite difference nodes.

Optionally, at 208, the calculated stress values at the plurality of finite difference nodes may be interpolated (e.g., using cubic spline interpolation) to determine stress values (e.g., minimum stress, maximum stress, and/or maximum allowable stress) at one or more points on the at least one section of the sucker rod string (e.g., at any depth).

Optionally, at 210, the interpolated stress values may be output to a display (e.g., connected with the control unit 110). For example, for a given depth, the interpolated stress values for minimum stress, maximum stress, and maximum allowable stress may be displayed (e.g., as shown in FIGS. 12 and 13).

Optionally, at 212, one or more pump parameters of a rod pump system (e.g., stroke speed, stroke length, minimum rod load, or maximum rod load) comprising the sucker rod string (e.g., reciprocating rod lift system 100) may be adjusted based, at least in part, on the interpolated stress values.

Example Modified Everitt-Jennings Algorithm

In order to diagnose and control a rod-pumped well, the behavior of the rod string may be simulated (e.g., calculated). One method to control a well is based on fillage calculated from a downhole card. Downhole data can be directly measured by a downhole dynamometer or can be calculated by solving the one-dimensional damped wave equation. However, calculating downhole conditions from measured surface data may be difficult because irreversible energy losses may occur along the rod string due to elasticity.

The irreversible energy losses may take the form of stress waves traveling down the rod string at the speed of sound. The one-dimensional damped wave equation may be used to model the propagation of stress waves in an ideal slender bar. Thus, considering the rod string to be prismatic, downhole conditions may be correctly calculated from the surface data using the one-dimensional damped wave equation. According to certain aspects, the modified Everitt-Jennings algorithm uses finite differences to solve the wave equation in order to model the behavior of the rod string. As part of the algorithm, an iteration on damping, a fluid load line calculation, and a pump fillage calculation are used in an effort to ensure that the downhole data is as accurate as possible.

The rod displacement of position x at time t, may be given by Equation 1:

$$u = u(x,t) \quad \text{(Eq. 1)}$$

Acoustic velocity (e.g., the velocity of sound in the rod string (ft/sec)) may be given by Equation 2:

$$v = \sqrt{\frac{144Eg}{\rho}} \quad \text{(Eq. 2)}$$

where E is Young's modulus of elasticity (psi), g is the gravity constant (32.2 (lbm-ft)/(lbf-sec$^2$)), and $\rho$ is the density of the sucker-rod string (lbm/ft$^3$).

Using the rod displacement u, the acoustic velocity v, and a damping factor c, the condensed one-dimensional wave equation may be given by Equation 3:

$$v^2 \frac{\partial^2 u}{\partial x^2} = \frac{\partial^2 u}{\partial t^2} + c \frac{\partial u}{\partial t}, \quad \text{(Eq. 3)}$$

In Eq. 3, only the damping force of viscous nature is considered. The damping force may be a complex sum of forces acting in the direction opposing the movement of the sucker-rod string, such as fluid forces and mechanical friction acting on the sucker-rod string, couplings, and tubing. Coulombs or mechanical friction effects may not be considered because of their dependence on unknown factors, such as deviation and corrosion. However, the fluid forces may be approximated by the viscous forces arising in the annular space. For example, let A represent the sucker-rod string's cross-sectional area (in.$^2$) and k represent the friction coefficient. In order to account for varying rod diameters, Eq. 3 may be expanded as shown in Equation 4:

$$EA \frac{\partial^2 u}{\partial x^2}(x, t) = \frac{\rho A}{144g} \frac{\partial^2 u}{\partial t^2}(x, t) - c \frac{\rho A}{144g} \frac{\partial u}{\partial t}(x, t), \quad \text{(Eq. 4)}$$

According to certain aspects, the Modified Everitt-Jennings algorithm may be used to solve the linear hyperbolic differential equation of Eq. 4. The Modified Everitt-Jennings method uses a finite difference model. For example, the Modified Everitt-Jennings algorithm may combine a finite difference engine to solve the wave equation along with a Pump Fillage Calculation (PFC), capable of computing accurate pump fillage regardless of downhole conditions and a Fluid Load Line Calculation (FLLC), which uses calculus and statistics to not only compute fluid load for a stroke, but also to approximate the amount of mechanical friction present in that particular stroke. The Modified Everitt-Jennings may incorporate an iteration on damping, using either single or dual damping factors. First-order-correct forward differences may be used as analogs for the first derivative with respect to time and second-order-correct central differences may be used as analogs for the second derivative with respect to time. A slightly rearranged second-order-correct central difference may used as the analog for the second derivative with respect to position to account for different taper properties.

Accordingly to certain aspects, the boundary conditions for Eq. 4 may be obtained directly from the surface position-versus-time and load-versus-time data. Because only the periodic solutions may be desired, initial conditions may not be used in Eq. 4. Let N represent the number of recorded surface data points and M be the total number of finite difference nodes along the rod string down the wellbore, such that the Mth finite difference node may be the last point above the pump. Let $\{i\}_1^M$ represent the vector of finite difference nodes along the rod string. Let $\{j\}_1^N$ represent the vector of sample points taken at the surface. Let $\{g_{PR}\}_1^N$ be the discrete function for the surface polished rod position-versus-time data and let $\{f_{PR}\}_1^N$ be the discrete function for the surface polished rod load-versus-time data.

One of the advantages of using finite differences to solve the wave equation is, as mentioned above, space discretization (e.g., the formation of a mesh). In the case of sucker-rod pumps, a mesh may be created in both time and space. The $\vec{i}$ direction is positive downwards as the mesh progresses down the rod string, while the $\vec{j}$ direction is taken to be the time increments between the surface data readings. This may allow each taper to be split into numerous smaller sections, which may be as short as a few feet. According to certain aspects, the finite difference analogs in Eq. 4 may be replaced to produce the following equations. Equation 5 shows the resulting equation for initialization:

$$\text{For } j=1, \ldots, N: u_{0,j} = g_{PR,j} \qquad (\text{Eq. 5})$$

Equation 6 shows the resulting equation from Hooke's law:

$$\text{For } j = 1, \ldots, N: u_{1,j} = \frac{f_{PR,j} \cdot \Delta x}{EA} + u_{0,j} \qquad (\text{Eq. 6})$$

where $\Delta x$ is the space between two finite difference nodes of a particular taper (ft).

Equation 7 shows the resulting equation:

$$\text{For } i = 2, \ldots, M: u_{i+1,j} = \frac{1}{\left(\frac{EA}{\Delta x}\right)^+} \qquad (\text{Eq. 7})$$

$$\left\{ [\alpha(1 + c\Delta t)] \cdot u_{i,j+1} - \left[ a(2 + c\Delta t) - \left(\frac{EA}{\Delta x}\right)^+ - \left(\frac{EA}{\Delta x}\right)^- \right] \cdot u_{i,j} + \alpha \cdot u_{i,j-1} - \left(\frac{EA}{\Delta x}\right)^- \cdot u_{i-1,j} \right\},$$

where $$\alpha = \frac{\overline{\Delta x}}{\Delta t^2} \left[ \frac{\left(\frac{\rho A}{144g}\right)^+ + \left(\frac{\rho A}{144g}\right)^-}{2} \right] \text{ and } \overline{\Delta x} = \frac{1}{2}(\Delta x^+ + \Delta x^-)$$

and $\Delta t$ is the time spacing between each surface sampling point (sec.)

Equations 8 and 9 show the resulting equations at the pump:

$$u_{pump,j} = (1 + c\Delta t) \cdot u_{M-1,j+1} - c\Delta t \cdot u_{M-1,j} + u_{M-1,j-1} - u_{M-1,j} \qquad (\text{Eq. 8})$$

$$F_{pump,j} = \frac{EA}{2\Delta x}(3u_{M,j} - 4u_{M-1,j} + u_{M-2,j}) \qquad (\text{Eq. 9})$$

where F represents the load acting on the rod element.

According to certain aspects, the stability condition associated with the above finite difference diagnostic model may be given as shown in Equation 10:

$$\frac{\Delta x}{v \Delta t} \leq 1 \qquad (\text{Eq. 10})$$

As shown in Eq. 10, the stability condition is satisfied when the ratio of the distance between the finite difference nodes—which is a uniform distance—to the product of the acoustic velocity in the rod sting and the sampling time is equal to or less than 1.

According to certain aspects, using finite differences as a tool to solve the wave equation enables the creation of a mesh (e.g., a space and time discretization) at each finite difference node for which position, load and, therefore, stress may be computed.

Aspects of the present disclosure provide an enhanced stress analysis using the Everitt-Jennings algorithm to calculate stress at any depth along a sucker rod string including uniform selection of the finite difference nodes and polynomial interpolation of stress calculations.

Example Uniform Selection of Finite Difference Nodes

As mentioned above, a tapered string includes multiple sections (e.g., "tapers"), each section having a different outer diameter, which generally decreases with increasing depth in a wellbore. Each section, or taper, may include one or more individual rod elements having that particular diameter.

Figure 14:
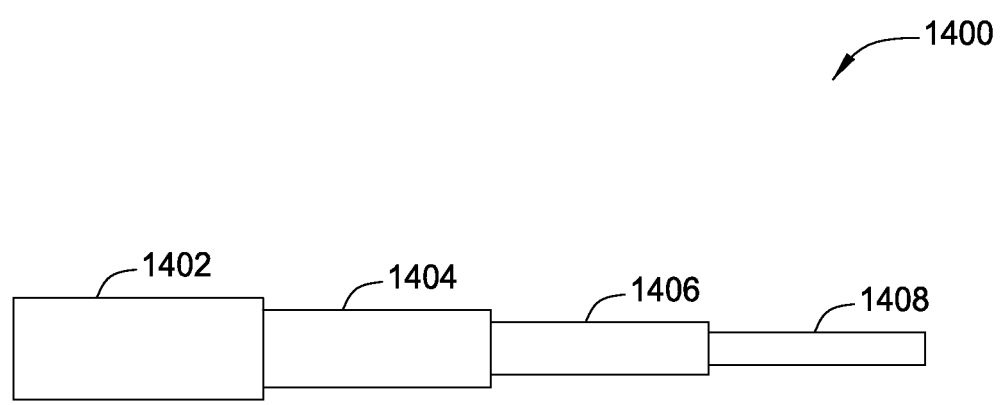
FIG. 14 is a diagram of an example tapered string having a plurality of tapers, in accordance with certain aspects of the present disclosure.

FIG. 14 is a diagram of an example tapered sucker rod string 1400 having a plurality of sections, in accordance with certain aspects of the present disclosure. Although in FIG. 14, the tapered sucker rod string 1400 is shown as having four tapers 1402, 1402, 1404, and 1406, this is merely exemplary, and the tapered sucker rod string 1400 could have more or less than four tapers. Tapers in the rod string 1400 may be of different lengths and materials. The weight of the sucker-rod string is distributed along its length, meaning any rod element carries at least the weight of the rod elements below. Ideally, the rod string may be designed to take into account deviation and corrosion, so that the rod string provides operation without failure for a reasonable amount of time (e.g., ten million cycles). Rod string design may involve determining rod size, lengths of the individual taper section, and the rod material used.

Rod strings are subject to cyclic loading, which creates a pulsating tension on the rod string. During the upstroke, the rod elements carry the load of the fluids, the dynamic loads, and the friction forces, while on the downstroke the rod elements carry the weight of the rod elements below, this time without the dynamic loads and friction. As mentioned above, changes in cross-sectional area in the rod string create areas of concentrated local stress.

While designing or analyzing sucker-rod strings, the maximum tensile and compressive stress to which the rod string may be subjected may be determined. Depending on the rod string design, the rod string may be more or less susceptible to failure at different locations of the taper.

Before solving the wave equation for the downhole data, the rod string may be divided into M finite difference nodes. The selection of the spacing for the nodes may be done per taper, as the properties of the tapers may vary. According to certain aspects, in an effort to provide a complete and thorough stress analysis, the finite difference elements, or nodes, may be selected in such a way that the $\Delta x$ or spacing in between each node is of similar magnitude for each taper. For example, an initial number of finite difference nodes (per taper) may be selected to satisfy the stability condition. The minimum $\Delta x$ for all tapers may then be used to compute the number of finite difference elements for the rest of the tapers to ensure a uniform mesh. The use of a quasi-uniform mesh may allow for a more detailed and practical analysis of the stress functions.

Example Per-Taper Cubic Spline Interpolation of Rod Stress

As mentioned above, using finite differences to solve the wave equation may enable for the computation of position, load, and stress at any level down the rod string. According to certain aspects, techniques for interpolating (e.g., cubic spline interpolation) the stress data are provided, so that a stress value can be output at any level down the rod string.

The stress data may be a series of taper-specific values. The progression of the stress data per-taper may be quasi-linear. In other words, the maximum tensile stress may occur at the bottom surface, while the maximum compression stress may occur at the top surface. The stress values may vary linearly from the top surface to the bottom surface. However, stress raisers along the rod may cause the stress values to vary non-linearly.

Various algorithms may be used for interpolating a discrete function: Taylor polynomials, Lagrange, Divided Differences, etc. Taylor polynomials, when used to interpolate a polynomial function, agree closely with the given function at a specific point, but the best accuracy is only available near that point. It may be desirable for interpolation to provide an accurate approximation over the entire interval.

Another approach for interpolating a discrete function may involve piecewise polynomial approximation. Using a piecewise polynomial approximation, the interval is split into several sub-intervals on which a different interpolating polynomial is generated. High-degree polynomials can have an oscillatory nature, which implies that even the slightest fluctuation over a portion of the interval could produce large fluctuations over the entire interval. The simplest piecewise-polynomial interpolation is piecewise linear interpolation. However, as mentioned above, the behavior of the stress data in the event of a stress raiser or a possible failure ceases to be linear. This implies that using piecewise linear interpolation may not be sufficiently accurate and could potentially hide the increased peak that would denote an area of high normal stress concentration.

According to certain aspects, cubic spline interpolation may be used. Cubic spline interpolation may be used to approximate stress at each taper using only four constants for each stress data point. One advantage of using a cubic spline interpolation is that it is relatively simple. Also, because cubic splines are third-degree polynomials, cubic splines are, therefore, continuously differentiable on the taper interval, providing a continuous second derivative. Hence, calculus methods may be used on the smooth cubic spline interpolant in order to search for possible stress raisers and imperfections in the stress data, which could in turn imply a future failure.

According to certain aspects, using the stress versus depth data, a cubic spline interpolant may be generated for each taper. The tridiagonal system generated during the cubic spline interpolation may then be solved, for example, using Crout Factorization or similar methods.

Downhole data may be computed for a particular stroke. The downhole data may include N position values for each of the M finite difference nodes down the rod string. According to certain aspects, using the position values and Hooke's Law, N load values may be obtained corresponding to the N position values. Stress values may then be computed using the formula for uniform normal stress shown in Equation 11:

$$\sigma = \frac{F}{A}, \quad \text{(Eq. 11)}$$

where σ represents the normal stress. Therefore, at any finite difference node down the rod string, the minimum stress, the maximum stress, and the maximum allowable stress may be computed. The minimum stress may be computed using the above equation by taking $F=F_{min}$, while the maximum stress may be computed by taking $F=F_{max}$. The computation of maximum allowable stress may use the minimum stress and the taper-specific values of tensile strength and service factor.

Figure 3:
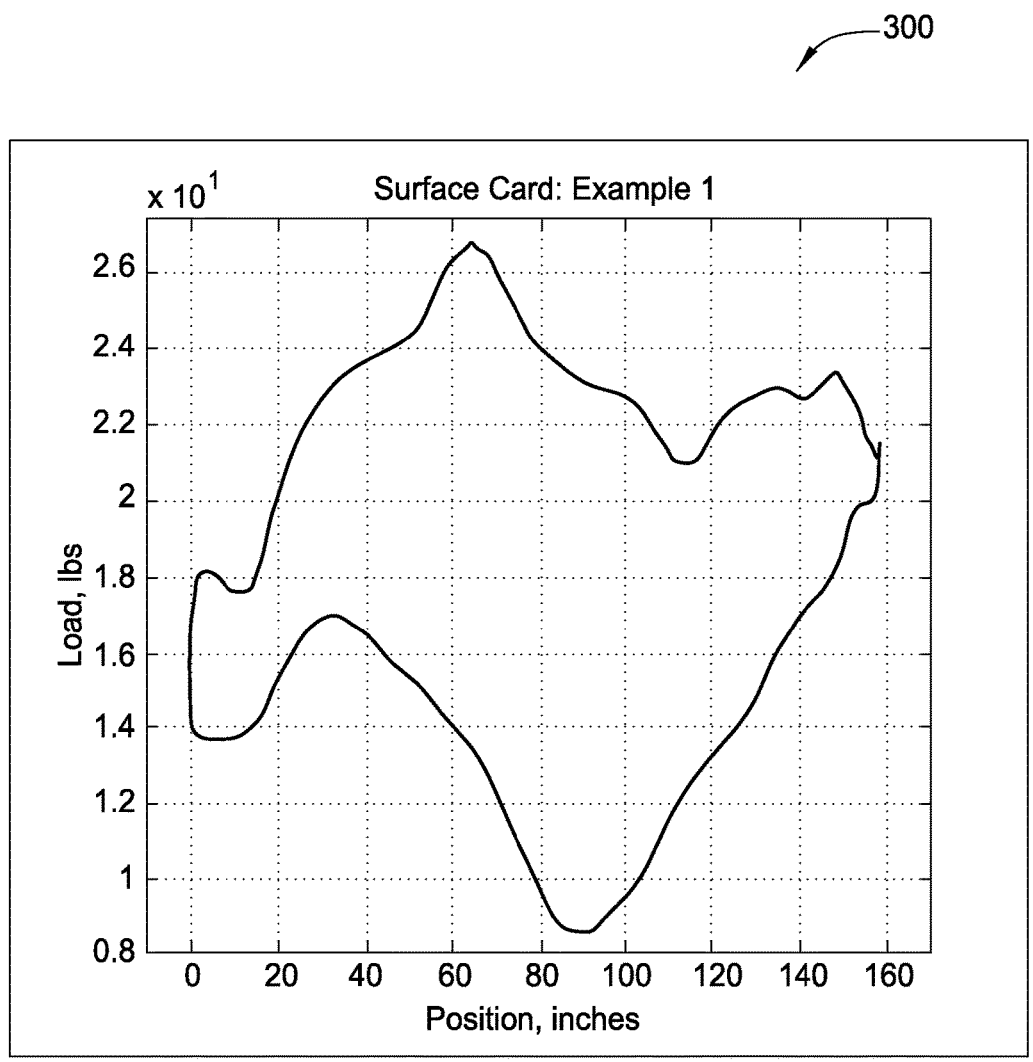
FIG. 3 illustrates a surface card for a first example well, in accordance with certain aspects of the present disclosure.
Figure 4:
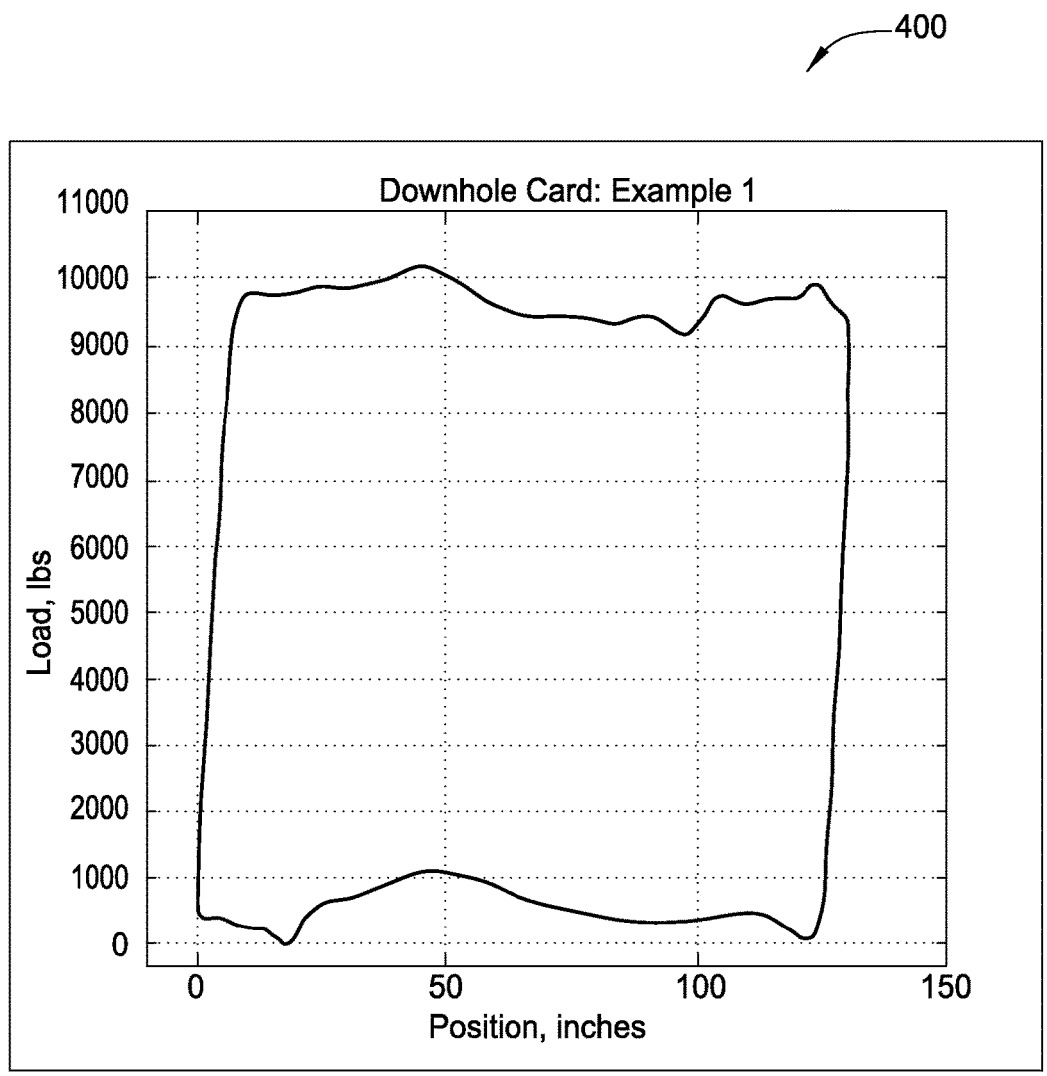
FIG. 4 illustrates a downhole card for the first example well, in accordance with certain aspects of the present disclosure.
Figure 6:
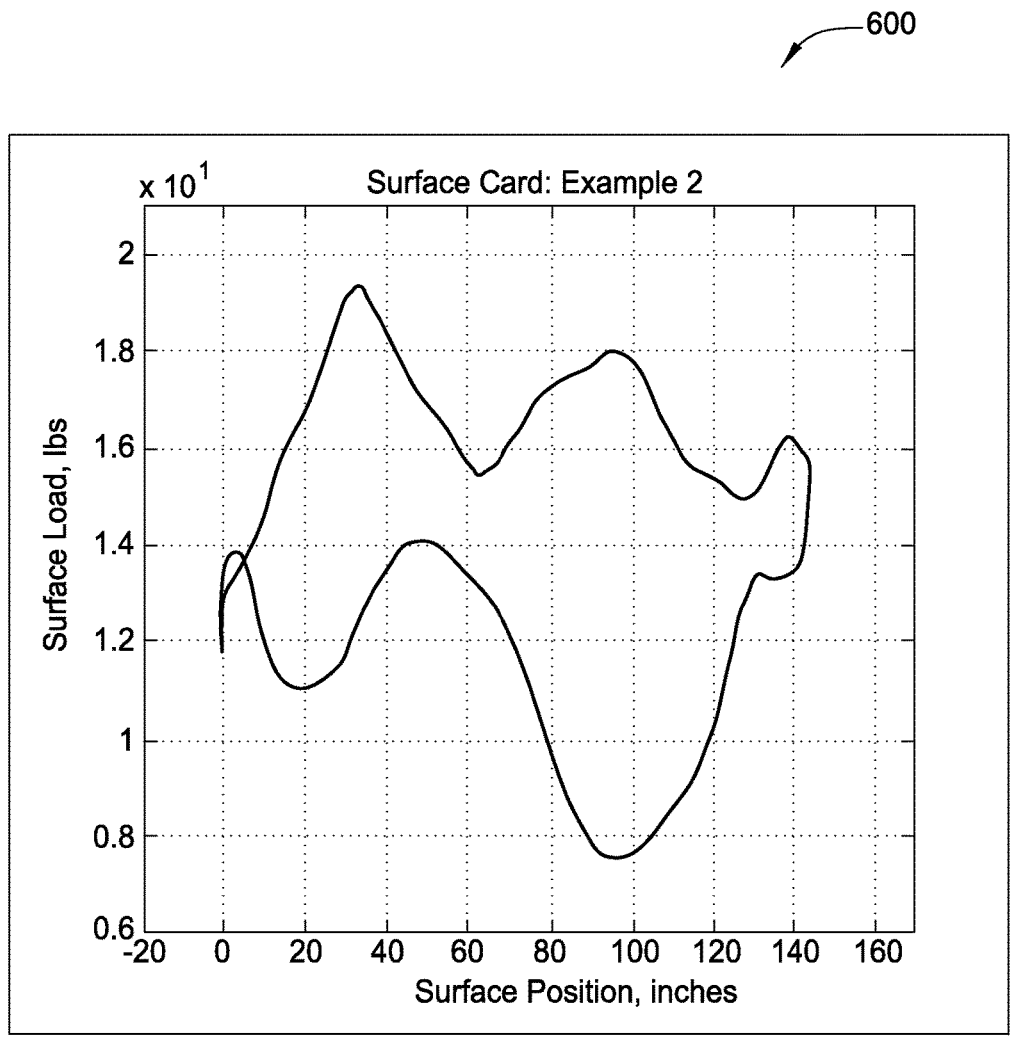
FIG. 6 illustrates a surface card for a second example well, in accordance with certain aspects of the present disclosure.
Figure 7:
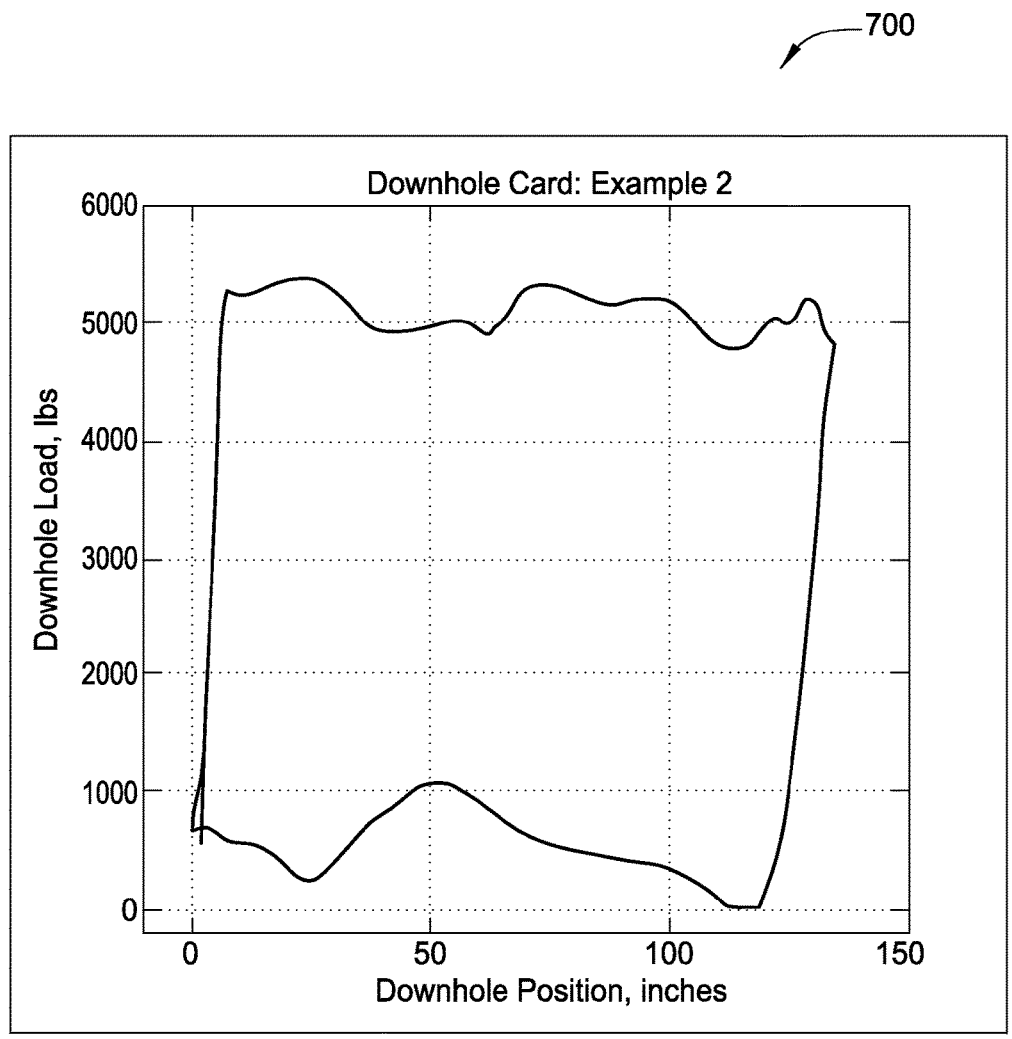
FIG. 7 illustrates a downhole card for the second example well, in accordance with certain aspects of the present disclosure.
Figure 8:
FIG. 8 is a table showing a rod configuration for the second example well, in accordance with certain aspects of the present disclosure.

The techniques described above may be used in an effort to ensure that the downhole data obtained through the Modified Everitt-Jennings algorithm is as accurate as possible to actual downhole data. FIGS. 3 and 4 illustrate an example surface card 300 and an example downhole card 400, respectively, for an example first well, in accordance with certain aspects of the present disclosure. FIG. 5 is a table 500 showing the rod configuration for the first example well, in accordance with certain aspects of the present disclosure. The first example well represents a deep well where steel rod elements (e.g., having a first tensile strength and service factor) combined with sinker bars are used. For each example, the stroke represents a full or near full pump fillage card FIGS. 6 and 7 illustrate an example surface card 600 and an example downhole card 700, respectively, for a second example well, in accordance with certain aspects of the present disclosure. FIG. 8 is a table 800 showing the rod configuration for the second example well, in accordance with certain aspects of the present disclosure. The second example well represents a shallower well than the first example well, and grade KD rod elements are used in the second example well, which would suggest a heavy-load application in an effectively inhibited corrosive environment. In the second example well, the KD rod elements are AISI 4720 nickel-chromium-molybdenum alloy steel (e.g., having a second tensile strength and service factor).

As shown in FIGS. 3-5 and FIGS. 6-8, the surface and downhole cards are different for the different wells, for example, due to different well conditions and different types of rods. FIG. 9 is an example table 900 showing results of stress analysis for the second well, in accordance with certain aspects of the present disclosure. The finite difference element distribution (third column in table 900) is displayed as related to the depth (first column in table 900) and taper number (second column in table 900). The matching values for the minimum stress, maximum stress and maximum allowable stress are also displayed in the fourth, fifth, and sixth columns, respectively, in table 900. For the second example well, the total number of finite difference elements M is 50. Although not shown in the figures, for the first example well, the total number of finite difference elements M is 80.

Figure 10:
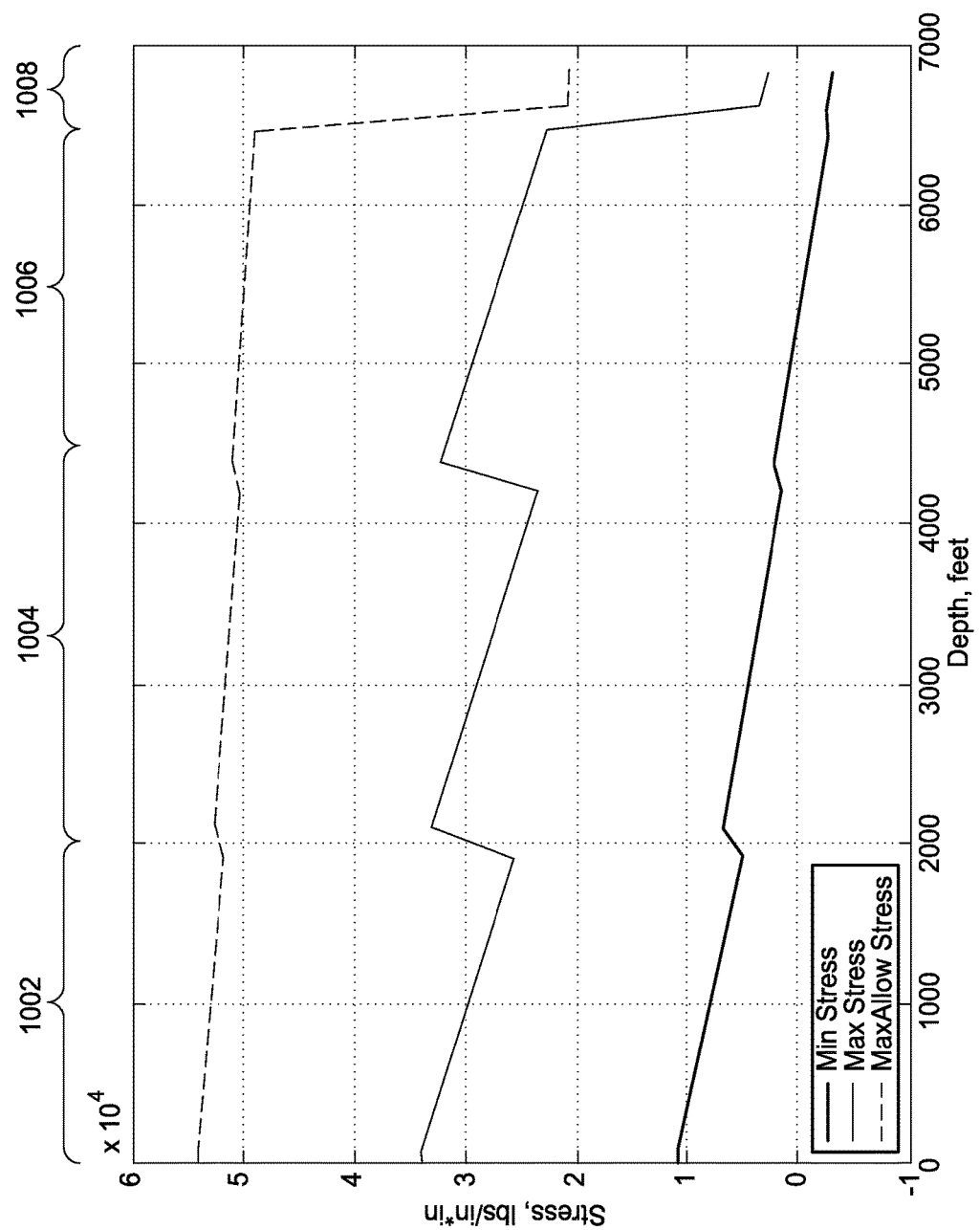
FIG. 10 is a graph showing the results of stress analysis for the first example well, in accordance with certain aspects of the present disclosure.
Figure 11:
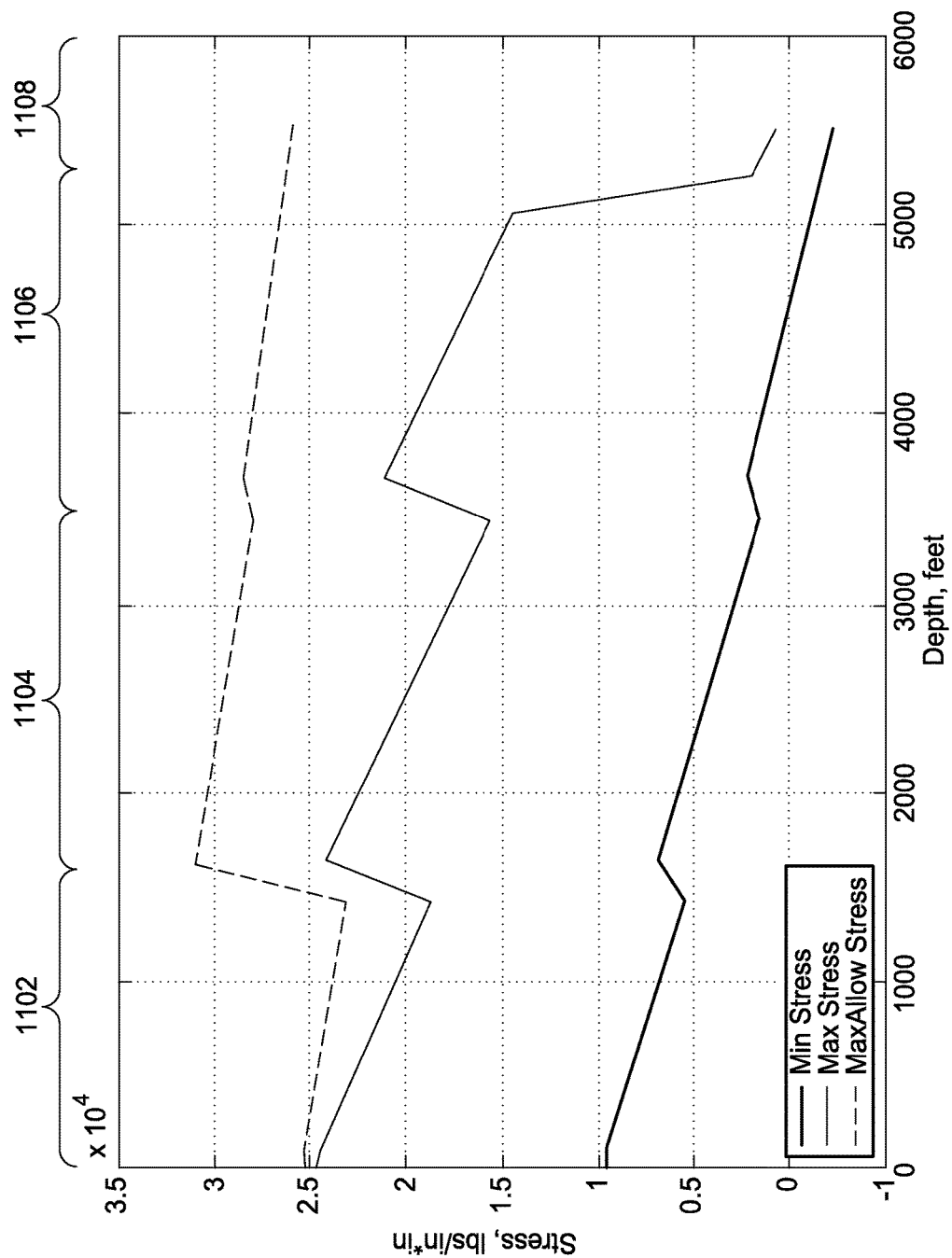
FIG. 11 is a graph showing the results of stress analysis for the second example well from the table of FIG. 9, in accordance with certain aspects of the present disclosure.

FIG. 10 is a graph 1000 showing the results of stress analysis for the first example well, in accordance with certain aspects of the present disclosure. FIG. 11 is a graph 1100 showing the results of stress analysis for the second example well from the table 900, in accordance with certain aspects of the present disclosure.

According to certain aspects, the first taper 1002 (or 1102), second taper 1004 (or 1104), third taper 1006 (or 1106), and fourth taper 1008 (or 1108) illustrated in FIG. 10 (or FIG. 11), may correspond to the tapers 1402, 1404, 1406, and 1408 illustrated in FIG. 14. In FIGS. 10 and 11, the results of the stress analysis for the minimum stress, the maximum stress, and the maximum allowable stress are plotted against the depth. The marker points on each of the three curves represent the finite difference nodes or elements. As shown in FIG. 10, for the first example well, the minimum stress starts at 10872 psi/in$^2$ and decreases to 5204 psi/in$^2$ for the first taper 1002. For the second taper 1004, the minimum stress starts at 6674 psi/in$^2$ decreasing to 1590 psi/in². For the third taper 1006, the minimum stress decreases from 2383 psi/in² to −2565 psi/in². For the fourth taper 1008, the minimum stress decreases from 2390 psi/in² to −2986 psi/in².

As shown in FIG. 10, the maximum stress for the first example well varies in a similar manner as the minimum stress. The maximum stress starts at 33964 psi/in² and decreases to 25599 psi/in² for the first taper 1002. For the second taper 1004, the maximum stress decreases from 33351 psi/in² to 23572 psi/in². For the third taper 1006, the maximum stress decreases from 32159 psi/in² to 22839 psi/in². For the fourth taper 1008, the maximum stress decreases from 3691 psi/in² to 2802 psi/in².

As shown in the FIG. 10, the maximum allowable stress for the first example well varies in a similar manner as the minimum and maximum stress, but with increased amplitude. For the first taper 1002, the maximum allowable stress starts at 54061 psi/in² and decreases to 51951 psi/in². For the second taper 1004, the maximum allowable stress decreases from 52502 psi/in² to 50596 psi/in². For the third taper 1006, the maximum allowable stress decreases from 50893 psi/in² to 49037 psi/in². For the fourth taper 1008, the maximum allowable stress decreases from 21155 psi/in² to 20820 psi/in².

As shown in the graph 1100 of FIG. 11, for the second example well, the minimum stress starts at 9596 psi/in² and decreases to 5364 psi/in² for the first taper 1102. For the second taper 1104, the minimum stress decreases from 6699 psi/in² to 1518 psi/in². For the third taper 1106, the minimum stress decreases from 2059 psi/in² to −1753 psi/in². For the fourth taper 1108, the minimum stress decreases from −1352 psi/in² to −2377 psi/in².

As shown in FIG. 11, the maximum stress for the second example well varies in a similar manner as the minimum stress. The maximum stress starts at 24511 psi/in² and decreases to 18654 psi/in² for the first taper 1102. For the second taper 1104, the maximum stress decreases from 24062 psi/in² to 15596 psi/in². For the third taper 1106, the maximum stress decreases from 21032 psi/in² to 14379 psi/in². For the fourth taper 1108, the maximum stress decreases from 1872 psi/in² to 693 psi/in².

As shown in the FIG. 11, the maximum allowable stress for the second example well varies in a similar manner as the minimum and maximum stress, but with increased amplitude. The maximum allowable stress starts at 25315 psi/in² and decreases to 23053 psi/in² for the first taper 1102. For the second taper 1104, the maximum allowable stress decreases from 30892 psi/in² to 28124 psi/in². For the third taper 1106 the maximum allowable stress decreases from 28413 psi/in² to 26589 psi/in². For the fourth taper 1108, the maximum allowable stress decreases from 26375 psi/in² to 26042 psi/in².

As shown in FIGS. 10 and 11, a jump occurs in the stress curves while transitioning from one taper to the next; this jump is attributed to the different taper properties. The finite difference nodes along the rod string are quasi-uniform to provide a more thorough analysis of the rod string.

When analyzing the stress values for a rod string, it may be desirable to maintain the peak stress under the maximum allowable stress, while keeping the minimum stress as high as possible. The closer the maximum stress is to the maximum allowable stress, the more loaded the rod string is and, therefore, the shorter its failure-free operation time may be. As shown in FIG. 11, for the second well, the calculated peak stress may be close to the maximum allowable stress. This implies that the rod elements in the first taper 1102 are highly loaded, which in turn implies that these rod elements may fail sooner than what is expected when considering the yield strength and tensile strength of these rod elements.

Conventionally, values for minimum stress, maximum stress, and maximum allowable stress are computed at the top of each taper. As shown in FIGS. 10 and 11, under normal conditions, the stress values of greatest magnitude may occur at the top of the taper and decrease almost linearly until the end of the taper. However, this assumption might no longer be valid in a deviated well. Displaying stress only at the top of the taper might not encapsulate any stress variation arising from points of high dogleg severity. Also, considering that tapers can be thousands of feet long, computing stress values at only one point seems a simplistic approach. Thus, minimum stress, maximum stress, and maximum allowable stress may be interpolated using cubic splines or another polynomial interpolation in an effort to produce a smooth function to enable the computation of minimum stress, maximum stress, and maximum allowable stress at any depth down the rod string. According to certain aspects, in the case where the desired depth lies at the edge a taper, for example, after the last finite difference node or before the first finite difference node on any taper, piecewise linear interpolation may be used to interpolate stress values at that point.

FIGS. 12 and 13 are tables 1200, 1300 showing example interpolated results for the minimum stress, maximum stress, and maximum allowable stress at a given depth for the first example well and the second example well, respectively. For both the first example well and the second example well, the stress results are interpolated for a depth of 1637 ft. For the first example well, this depth occurs in the first taper 1002, in between finite difference element 18 and 19. As shown in table 1200, for the first example well, the interpolated values for minimum stress, maximum stress, and maximum allowable stress are 6016 psi/in², 26949 psi/in², and 52256 psi/in², respectively. For the second example well, this depth occurs in the second taper 1004, in between elements 1 and 2. As shown in table 1300, the interpolated values for minimum stress, maximum stress and maximum allowable stress are 6685 psi/in², 24039 psi/in², and 30885 psi/in², respectively.

The ability to compute stress values at any depth down the rod string may allow for improved management of downhole conditions such as deviation or corrosion. When the dogleg severity of the wellbore path is above a certain risk angle, it is then possible to focus on the stress values at that point and in the vicinity of that point, providing an improved picture of the loads and stresses for that particular rod section. This may be useful for anticipating rod failures.

The techniques described above may rely on the accurate computation of downhole data. When computing downhole data from surface data using the wave equation, it is desirable to handle viscous damping properly. Additionally, although the wave equation assumes a vertical-hole model, often it is applied to wells having non-negligible deviation. The Modified Everitt-Jennings algorithm combines robust iteration on damping along with fluid load line computation capable of estimating the presence of mechanical friction in the well. This may ensure accurate downhole data regardless of downhole conditions.

The above stress analysis methodology, as part of the Modified Everitt-Jennings algorithm, may allow the user to monitor any section of the rod string. Stress values can be computed at every finite difference element, which can be spaced apart as small as a few feet, for example. Additionally, the capability to compute interpolated stress values at any depth may allow the user in-depth inspection of the stress distribution at a certain point or series of points, completing the stress analysis picture.

Using the above methodologies, it may be possible to more accurately anticipate the life of a rod string. Based on the in-depth stress analysis, and the detailed results on the loading of any particular section of the rod string, the user can anticipate what the life of a rod, taper, or installation is going to yield.

As used herein, the term "determining" encompasses a wide variety of actions. For example, "determining" may include calculating, computing, processing, deriving, and the like. As used herein, a phrase referring to "at least one of" a list of items refers to any combination of those items, including single members.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

Any of the operations described above may be included as instructions in a computer-readable medium for execution by the control unit 110 or any other processing system. The computer-readable medium may comprise any suitable memory for storing instructions, such as read-only memory (ROM), random access memory (RAM), flash memory, an electrically erasable programmable ROM (EEPROM), a compact disc ROM (CD-ROM), or a floppy disk.

While the foregoing is directed to aspects of the present disclosure, other and further aspects of the disclosure may be devised without departing from the basic scope thereof, and the scope thereof is determined by the claims that follow.

The invention claimed is:

1. A method for determining stress along a sucker rod string disposed in a wellbore, comprising:
   receiving, at a processor, measured rod displacement and rod load data for the sucker rod string, wherein the sucker rod string comprises a plurality of sections;
   selecting a plurality of finite difference nodes such that the selected finite difference nodes have a uniform spacing throughout the plurality of sections, wherein the selecting comprises:
      determining an initial number of the finite difference nodes, and an initial spacing associated therewith, for each of the plurality of sections to satisfy a stability condition; and
      selecting a minimum spacing out of the initial spacings as the uniform spacing for the plurality of sections;
   calculating, at the processor, stress values at the plurality of finite difference nodes for at least one of the plurality of sections based, at least in part, on the measured rod displacement and rod load data;
   interpolating the calculated stress values at the plurality of finite difference nodes to determine interpolated stress values at one or more points on the at least one section of the sucker rod string; and
   adjusting one or more pump parameters of a rod pump system comprising the sucker rod string based, at least in part, on the interpolated stress values.

2. The method of claim 1, wherein the sucker rod string comprises a tapered string and wherein a first set of the plurality of sections has a different outer diameter than a second set of the plurality of sections.

3. The method of claim 1, wherein calculating the stress values at the plurality of finite difference nodes comprises:
   using a one-dimensional wave equation to model stress waves travelling in the sucker rod string; and
   solving the one-dimensional wave equation using finite element modeling based on the plurality of finite difference nodes.

4. The method of claim 3, wherein the stability condition is defined as a ratio of the spacing between the selected finite difference nodes to a product of acoustic velocity in the sucker rod string and a sampling time for the rod displacement and rod load data being equal to or less than 1.

5. The method of claim 1, wherein the interpolating comprises performing cubic-spline interpolation of the calculated stress values.

6. The method of claim 1, wherein the one or more pump parameters comprise at least one of stroke speed, stroke length, minimum rod load, or maximum rod load.

7. The method of claim 1, further comprising outputting the interpolated stress values to a display.

8. A system comprising:
   a sucker rod string comprising a plurality of sections disposed in a wellbore;
   at least one sensor configured to measure rod displacement of the sucker rod string;
   at least one sensor configured to measure rod loading of the sucker rod string; and
   a processor configured to:
      select a plurality of finite difference nodes such that the selected finite difference nodes have uniform spacing throughout the plurality of sections, wherein the selecting comprises:
         determining an initial number of the finite difference nodes, and an initial spacing associated therewith, for each of the plurality of sections to satisfy a stability condition; and
         selecting a minimum spacing out of the initial spacings as the uniform spacing in the plurality of sections;
      calculate stress values at the plurality of finite difference nodes for at least one of the plurality of sections based, at least in part, on the measured rod displacement and rod load data.

9. The system of claim 8, wherein the sucker rod string comprises a tapered string and wherein a first set of the plurality of sections has a different outer diameter than a second set of the plurality of sections.

10. The system of claim 8, wherein calculating the stress values at the plurality of finite difference nodes comprises:
    using a one-dimensional wave equation to model stress waves travelling in the sucker rod string; and
    solving the one-dimensional wave equation using finite element modeling based on the plurality of finite difference nodes.

11. The system of claim 10, wherein the stability condition is defined as a ratio of the spacing between the selected finite difference nodes to a product of acoustic velocity in the sucker rod string and a sampling time for the rod load and rod displacement measurements being equal to or less than 1.

12. The system of claim 8, wherein the processor is further configured to:
    interpolate the calculated stress values at the plurality of finite difference nodes to determine interpolated stress values at one or more points on the at least one section of the sucker rod string.

13. The system of claim 12, wherein the processor is configured to interpolate the calculated stress values by performing cubic-spline interpolation of the calculated stress values.

14. The system of claim 12, wherein the processor is further configured to:
adjust one or more pump parameters of a rod pump system comprising the sucker rod string based, at least in part, on the interpolated stress values.

15. The system of claim 14, wherein the one or more pump parameters comprise at least one of stroke speed, stroke length, minimum rod load, or maximum rod load.

16. The system of claim 12, wherein the processor is further configured to:
output the interpolated stress values to a display.

17. A non-transitory computer-readable medium having computer-executable code stored thereon for:
receiving measured rod displacement and rod load data for a sucker rod string, wherein the sucker rod string comprises a plurality of sections;
selecting a plurality of finite difference nodes such that the selected finite difference nodes have a uniform spacing throughout the plurality of sections, wherein the selecting comprises:
determining an initial number of the finite difference nodes, and an initial spacing associated therewith, for each of the plurality of sections to satisfy a stability condition; and
selecting a minimum spacing out of the initial spacings as the uniform spacing for the plurality of sections;
calculating stress values at the plurality of finite difference nodes for at least one of the plurality of sections based, at least in part, on the measured rod displacement and rod load data;
interpolating the calculated stress values at the plurality of finite difference nodes to determine interpolated stress values at one or more points on the at least one section of the sucker rod string; and
adjusting one or more pump parameters of a rod pump system comprising the sucker rod string based, at least in part, on the interpolated stress values.

18. The computer-readable medium of claim 17, wherein calculating the stress values at the plurality of finite difference nodes comprises:
using a one-dimensional wave equation to model stress waves travelling in the sucker rod string; and
solving the one-dimensional wave equation using finite element modeling based on the plurality of finite difference nodes.

19. The computer-readable medium of claim 18, wherein the stability condition is defined as a ratio of the spacing between the selected finite difference nodes to a product of acoustic velocity in the sucker rod string and a sampling time for the rod displacement and rod load data being equal to or less than 1.

20. The computer-readable medium of claim 17, wherein the interpolating comprises performing cubic-spline interpolation of the calculated stress values.

* * * * *